(12) United States Patent
Regnier

(10) Patent No.: US 9,345,128 B2
(45) Date of Patent: May 17, 2016

(54) MULTI-LAYER CIRCUIT MEMBER AND ASSEMBLY THEREFOR

(75) Inventor: Kent E. Regnier, Lombard, IL (US)

(73) Assignee: Molex, LLC, Lisle, IL (US)

( * ) Notice: Subject to any disclaimer, the term of this patent is extended or adjusted under 35 U.S.C. 154(b) by 429 days.

(21) Appl. No.: 13/508,209

(22) PCT Filed: Nov. 4, 2010

(86) PCT No.: PCT/US2010/055453
§ 371 (c)(1),
(2), (4) Date: Jul. 25, 2012

(87) PCT Pub. No.: WO2011/056977
PCT Pub. Date: May 12, 2011

(65) Prior Publication Data
US 2012/0282807 A1    Nov. 8, 2012

Related U.S. Application Data

(60) Provisional application No. 61/258,976, filed on Nov. 6, 2009.

(51) Int. Cl.
*H01R 13/646*    (2011.01)
*H05K 1/00*    (2006.01)
*H05K 1/02*    (2006.01)
(Continued)

(52) U.S. Cl.
CPC .......... *H05K 1/0227* (2013.01); *H01R 13/6469* (2013.01); *H05K 1/0245* (2013.01); *H05K 1/0248* (2013.01); *H01R 13/6633* (2013.01); *H01R 2107/00* (2013.01); *H05K 1/0233* (2013.01); *H05K 3/3447* (2013.01); *H05K 3/429* (2013.01); *H05K 2201/09263* (2013.01); *H05K 2201/09309* (2013.01); *H05K 2201/09336* (2013.01); *H05K 2201/09663* (2013.01); *H05K 2201/1006* (2013.01); *H05K 2201/10189* (2013.01); *H05K 2201/10371* (2013.01); *H05K 2203/0307* (2013.01)

(58) Field of Classification Search
CPC . H01R 13/6469; H05K 1/0227; H05K 1/0225
USPC .......................................... 367/793; 361/793
See application file for complete search history.

(56) References Cited

U.S. PATENT DOCUMENTS 6,179,627 B1    1/2001    Daly et al.
6,388,208 B1    5/2002    Kiani et al.
(Continued)

FOREIGN PATENT DOCUMENTS

CN    101052272 A    10/2007
CN    101346040 A    1/2009
(Continued)

OTHER PUBLICATIONS

International Search Report for PCT/US2010/055453.

*Primary Examiner* — William H Mayo, III
*Assistant Examiner* — Hiram E Gonzalez
(74) *Attorney, Agent, or Firm* — Stephen L. Sheldon

(57) ABSTRACT

A multi-layer circuit member includes a conductive reference plane with first and second electrically connected regions. A pair of signal conductors are in proximity to the first region and a circuit component is in proximity to the second region. An area of increased impedance exists between the first and second electrically connected regions.

14 Claims, 15 Drawing Sheets

(51) Int. Cl.
  *H01R 13/6469* (2011.01)
  *H01R 13/66* (2006.01)
  *H01R 107/00* (2006.01)
  *H05K 3/34* (2006.01)
  *H05K 3/42* (2006.01)

(56) References Cited

U.S. PATENT DOCUMENTS

| | | |
|---|---|---|
| 6,431,887 B1 | 8/2002 | Yeomans et al. |
| 6,893,270 B2 | 5/2005 | Sercu |
| 7,110,263 B2 * | 9/2006 | He et al. .......... 361/794 |
| 7,564,695 B2 * | 7/2009 | Matsumoto ........ 361/794 |
| 2002/0015293 A1 * | 2/2002 | Akiba et al. ...... 361/793 |
| 2006/0139117 A1 | 6/2006 | Brunker et al. |
| 2006/0232301 A1 | 10/2006 | Morlion et al. |
| 2008/0101050 A1 * | 5/2008 | Fung ................ 361/794 |
| 2011/0139489 A1 * | 6/2011 | Yoon et al. ....... 174/250 |
| 2012/0133458 A1 * | 5/2012 | Kato et al. ........ 333/238 |

FOREIGN PATENT DOCUMENTS

| | | |
|---|---|---|
| JP | 06-252612 A | 9/1994 |
| JP | 2007-234500 A | 9/2007 |

* cited by examiner

MULTI-LAYER CIRCUIT MEMBER AND ASSEMBLY THEREFOR

CROSS-REFERENCE TO RELATED APPLICATIONS

This patent application claims priority to PCT Application No. PCT/US10/55453, filed Nov. 4, 2010, which in turn claims the benefit of U.S. Provisional Patent Application No. 61/258,976, filed May 6, 2010, which is incorporated herein by reference in its entirety.

BACKGROUND

This disclosure relates generally to a multi-layer circuit member and, more particularly, to a multi-layer circuit member having an improved reference circuit.

Electronic devices commonly use multi-layer circuit boards or members for transmitting and receiving high speed as well as high data rate signals. With the desire for higher speed electronics in the same or smaller footprints, an ongoing challenge exists to increase the density of the multi-layer circuit boards. Some multi-layer circuit boards include one or more reference or ground planes embedded within the circuit board together with various signal conductors for transmitting the desired information or data along or through the circuit board. While such reference planes act as an electrical shield, they also typically act as a portion of the return path for the various signal conductors of the circuit board. Energy or noise transferred to a first reference plane from another source such as a circuit component, signal conductor, or another reference plane acting as a return path for other signal conductors, may affect signals conducted by signal conductors coupled to the first reference plane. In other words, such energy within a circuit board may sometimes be undesirably transferred to other circuitry within the circuit board which may cause errors in the system and otherwise render the system less reliable or inoperative. It is therefore desirable to minimize the impact that any energy source may have on a set of signal conductors even though the signal conductors may be separated from the energy source.

SUMMARY

In one example, a multi-layer circuit member includes a conductive reference plane with first and second electrically connected regions. A pair of signal conductors are in proximity to the first region and a circuit component is in proximity to the second region. An area of increased impedance exists between the first and second electrically connected regions.

In another example, a multi-layer circuit member includes a conductive reference plane with first and second electrically connected regions. A first pair of signal conductors is adjacent the first region of the reference plane and a second pair of signal conductors is adjacent the second region of the reference plane. An elongated area of increased impedance in the reference plane is located between the first and second electrically connected regions.

In another example, a multi-layer circuit member includes a conductive reference plane with first and second electrically conductive regions. The first and second regions are electrically connected and have an elongated slot therebetween. A conductive plane is spaced from the reference plane and includes a first pair of generally parallel signal conductors adjacent the first region of the reference plane and a second pair of generally parallel signal conductors adjacent the second region of the reference plane. A plug connector assembly may also be provided.

BRIEF DESCRIPTION OF THE DRAWINGS

Various other objects, features and attendant advantages will become more fully appreciated as the same becomes better understood when considered in conjunction with the accompanying drawings in which like reference characters designate the same or similar parts throughout the several views, and in which.

DETAILED DESCRIPTION OF THE ILLUSTRATED EMBODIMENTS

The following description is intended to convey the operation of exemplary embodiments to those skilled in the art. It will be appreciated that this description is intended to aid the reader, not to limit the invention. As such, references to a feature or aspect are intended to describe a feature or aspect of an embodiment, not to imply that every embodiment must have the described characteristic. Furthermore, it should be noted that the depicted detailed description illustrates a number of features. While certain features have been combined together to illustrate potential system designs, those features may also be used in other combinations not expressly disclosed. Thus, the depicted combinations are not intended to be limiting unless otherwise noted.

It is often desirable to increase the electrical separation or isolation between certain circuit components within a circuit board or member. In particular, in certain high speed systems, improved performance may be realized by increasing the isolation between certain signal conductors such as by electrically separating the conductors designated for transmitting signals from those conductors designated for receiving signals. Circuit members will often include a common reference or ground layer that functions not only as a shield but also may act as a return path for the associated signal conductors. For example, signals transmitted along one signal conductor or pair of conductors will typically impart some energy into an associated reference plane at a region or area adjacent the signal conductors. Due to the conductive nature of the reference plane, that energy will travel along the reference plane to other regions remote from the region adjacent the signal conductors. If such remote regions are adjacent other signal conductors, the energy in the reference plane may negatively affect signals transmitted along those other remote signal conductors. The energy in the reference plane from the first set of signal conductors can function as noise with respect to the other remote signal conductors associated with the same reference plane.

Figure 1:
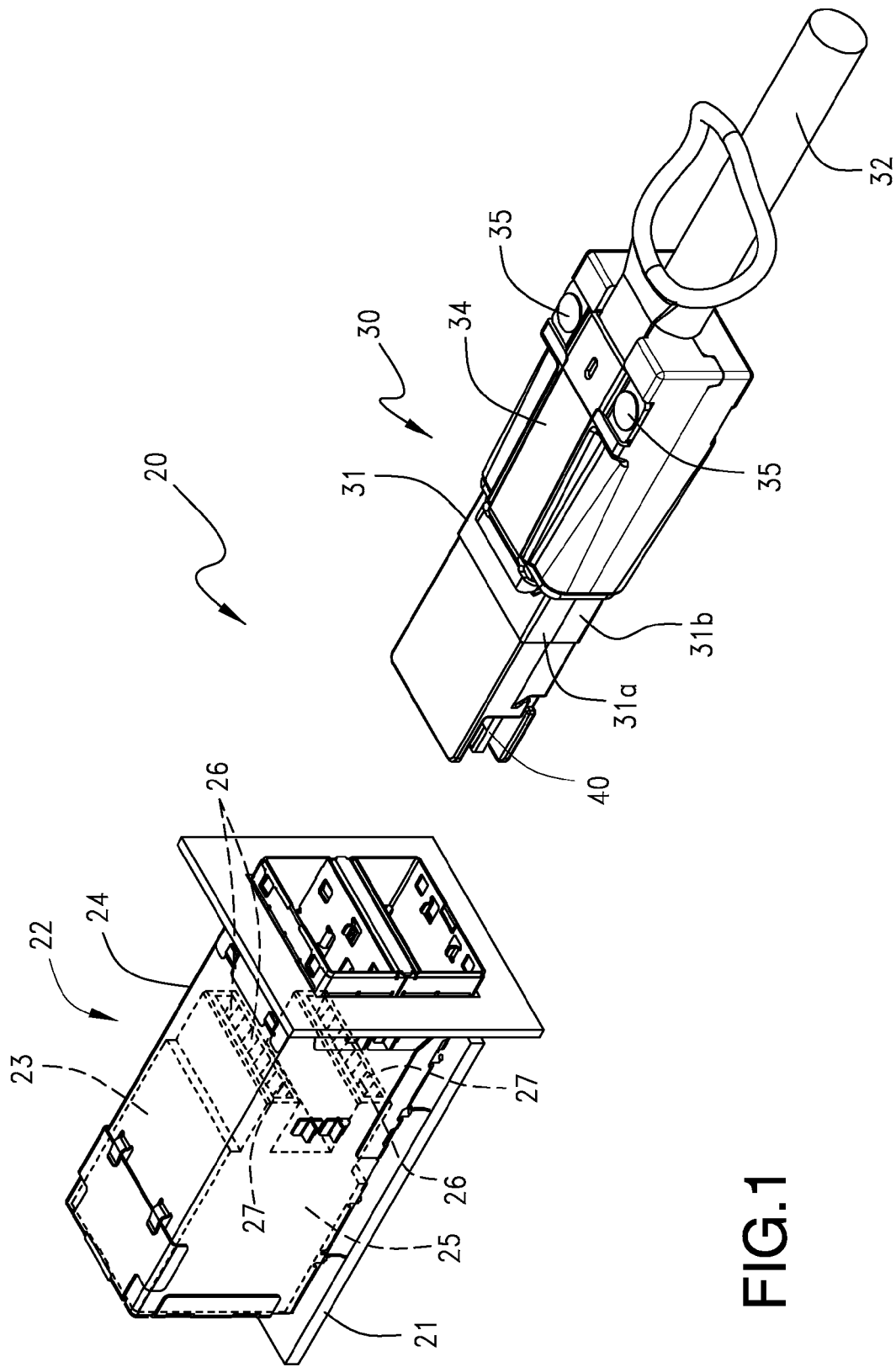
FIG. 1 is a perspective view of a plug connector assembly aligned with a mating electrical connector assembly in accordance with a first embodiment.
Figure 2:
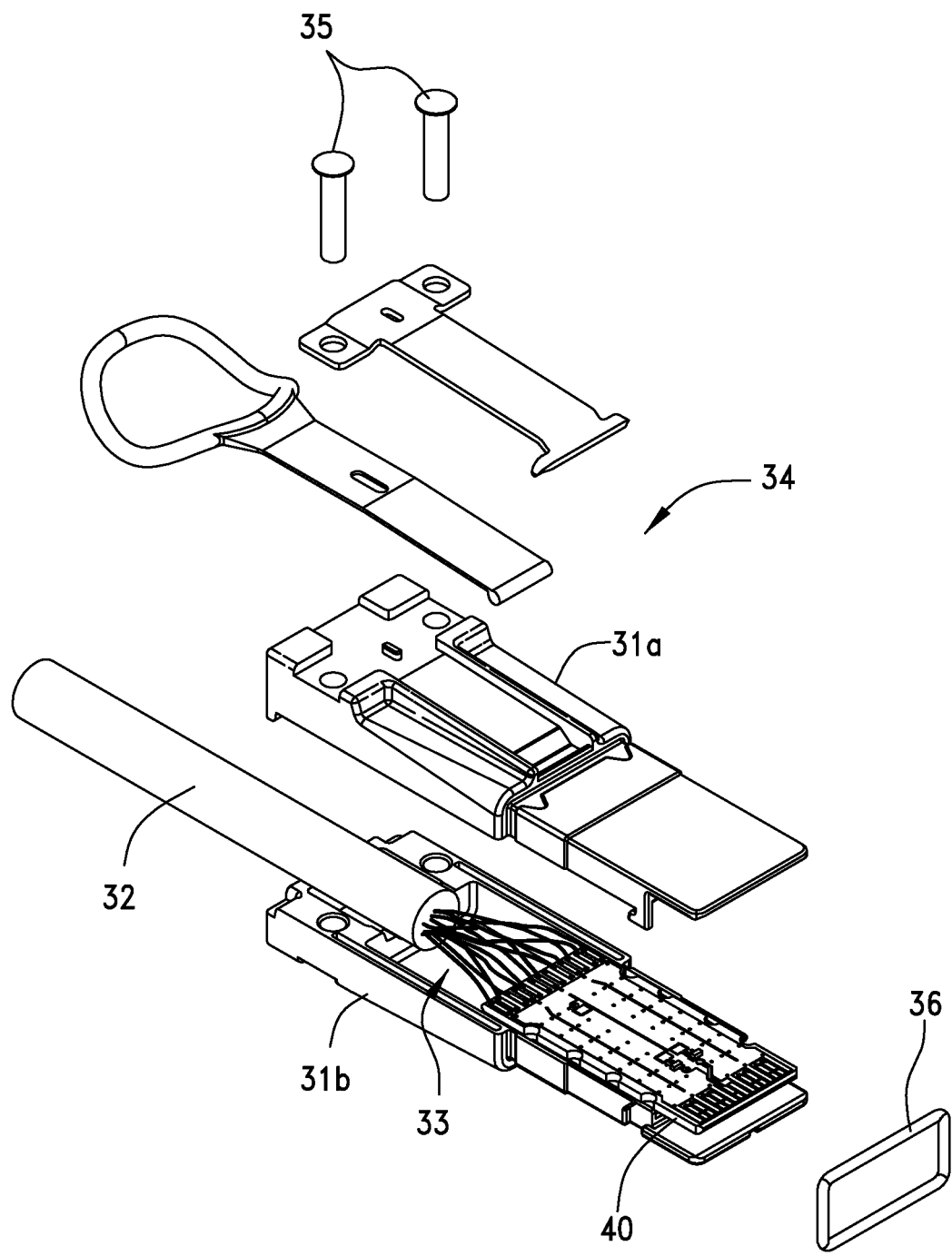
FIG. 2 is a partially exploded perspective view of the plug connector assembly of FIG. 1.

Referring to FIGS. 1 and 2, an electrical connector system 20 is illustrated with a board mounted connector assembly 22 and a cable assembly 30. Board mounted connector assembly 22 is mounted on circuit board 21 and has an electrical connector 23 and a conductive shield or cage 24 surrounding the connector 23. As depicted, connector 23 and cage 24 are configured to receive two cable assemblies 30 in a vertically stacked array. Connector 23 has a dielectric housing 25 with a plurality of electrically conductive contacts or terminals 26 therein positioned along a pair of slots 27 for establishing an electrical connection with conductors of the cable assembly 30.

Cable assembly 30 includes a two-piece, conductive housing 31 with a cable 32 having a plurality of wires 33 and a circuit board 40 positioned within the housing and a latching mechanism 34 mounted on housing. During assembly, the wires 33 are soldered to contact pads 121-128 on circuit board 40 and then potted or overmolded with a protective, non-conductive material (not shown). The upper and lower housing components 31*a*, 31*b* are secured together through the use of fasteners such as rivets 35, which also secure the latching mechanism 34 to the housing. If desired, an EMI gasket 36 may be provided.

Figure 15:
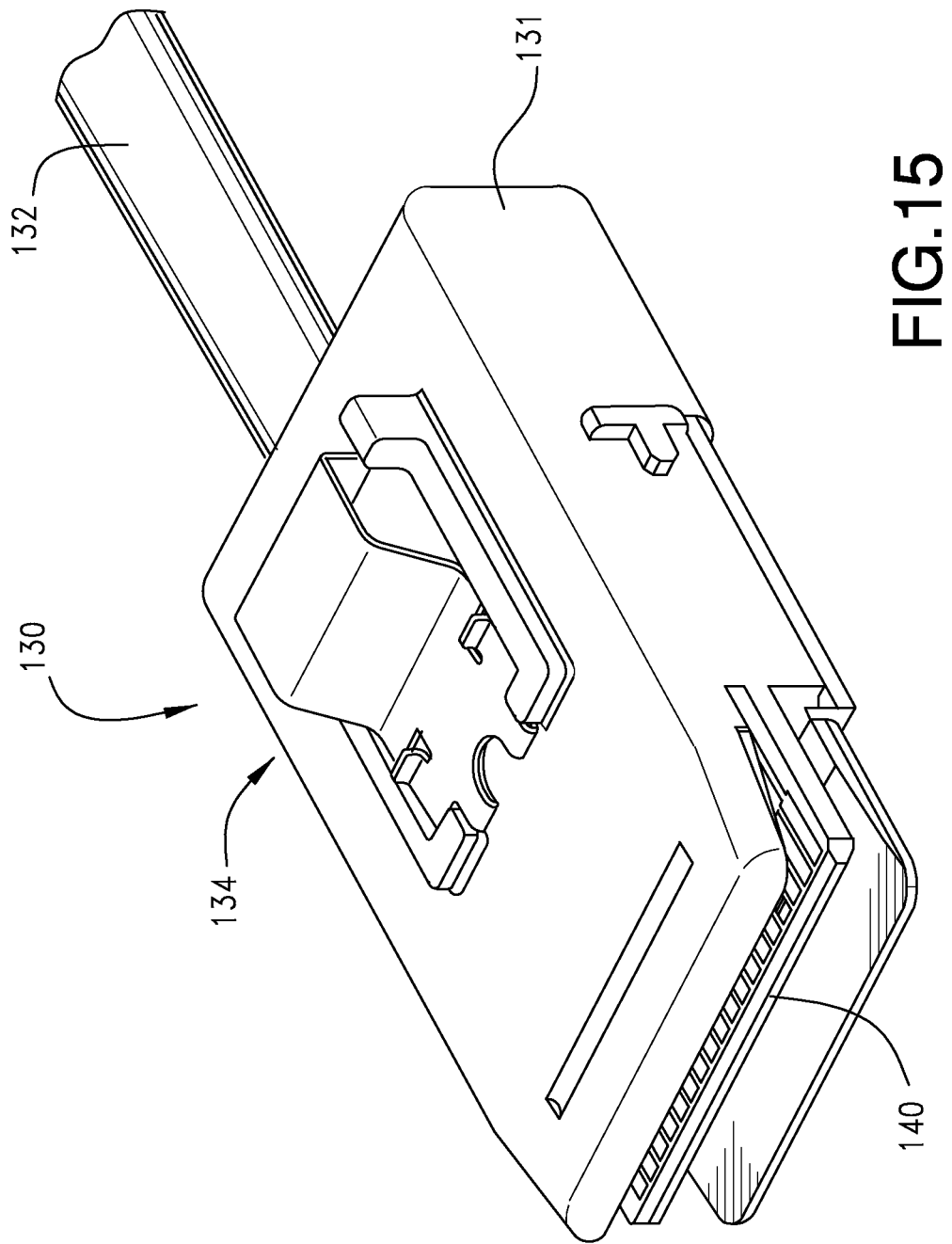
FIG. 15 is a perspective view of an alternate embodiment of a plug connector assembly in which a circuit board similar to that depicted in FIG. 3 could be utilized.

FIG. 15 depicts a cable assembly 130 of a second, alternate embodiment. Cable assembly 130 is similar to cable assembly 30 but is generally configured for mating with an unshielded connector assembly (not shown) similar to board mounted connector assembly 22 but without the conductive shield 24 thereon. Such unshielded connector assembly and cable assembly 130 may be used within a chassis or housing of electronic equipment such as data handling equipment in which external shielding structure is not necessary. Cable assembly 130 includes a dielectric housing 131 with a circuit board 140 therein terminated to wires (not shown) of cable 132. Latching mechanism 134 may be provided to secure cable assembly 130 to its mating connector assembly. Circuit board 140 of cable assembly 130 may have identical or similar functionality and structure to that of circuit board 40.

It should be noted that in this description, representations of directions such as up, down, left, right, front, rear, and the like, used for explaining the structure and movement of each part of the disclosed embodiment are not intended to be absolute, but rather are relative. These representations are appropriate when each part of the disclosed embodiment is in the position shown in the figures. If the position or frame of reference of the disclosed embodiment changes, however, these representations are to be changed according to the change in the position or frame of reference of the disclosed embodiment.

Figure 3:
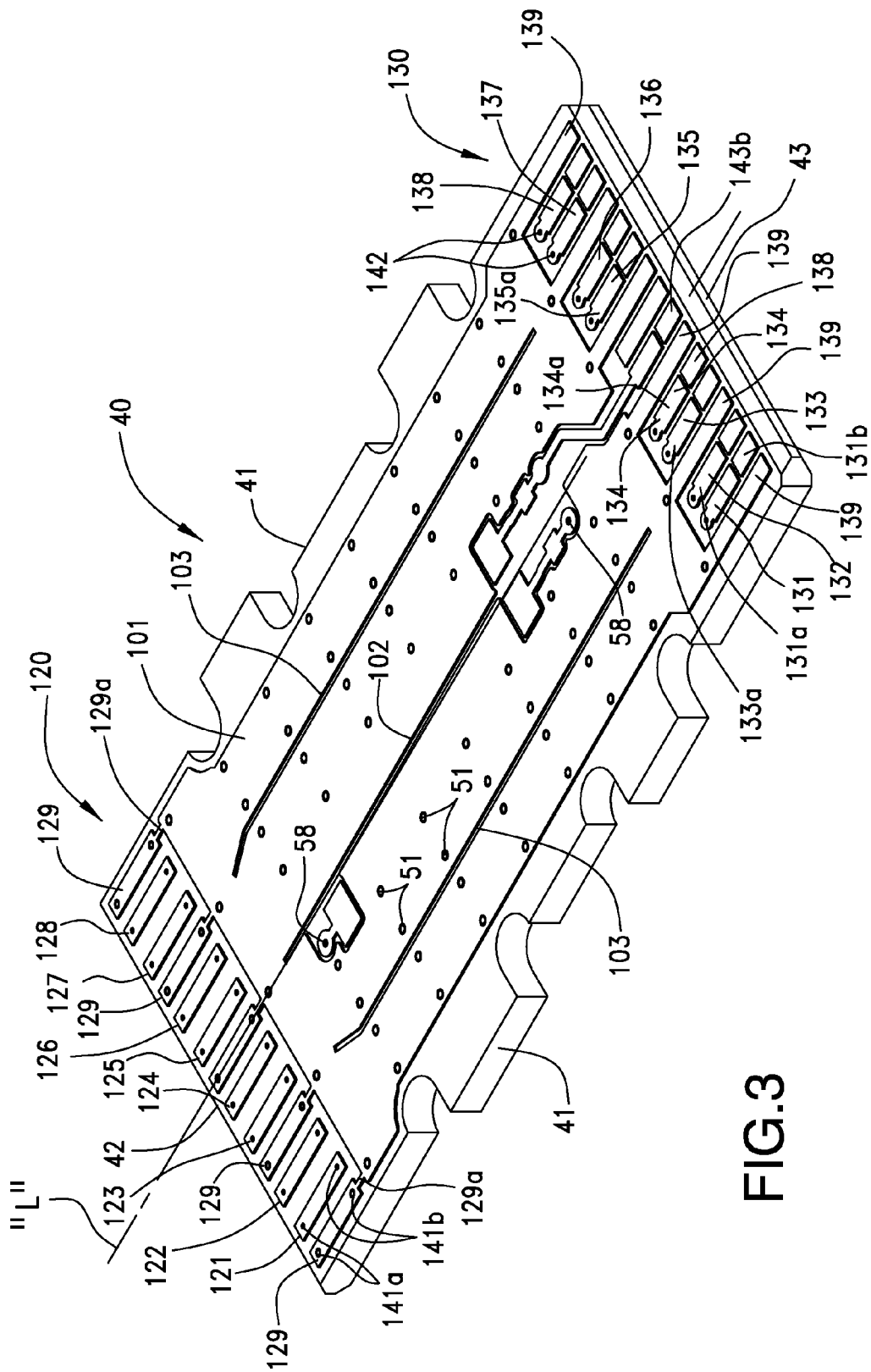
FIG. 3 is a perspective view of a circuit board used with the plug connector assembly of FIG. 2.
Figure 4:
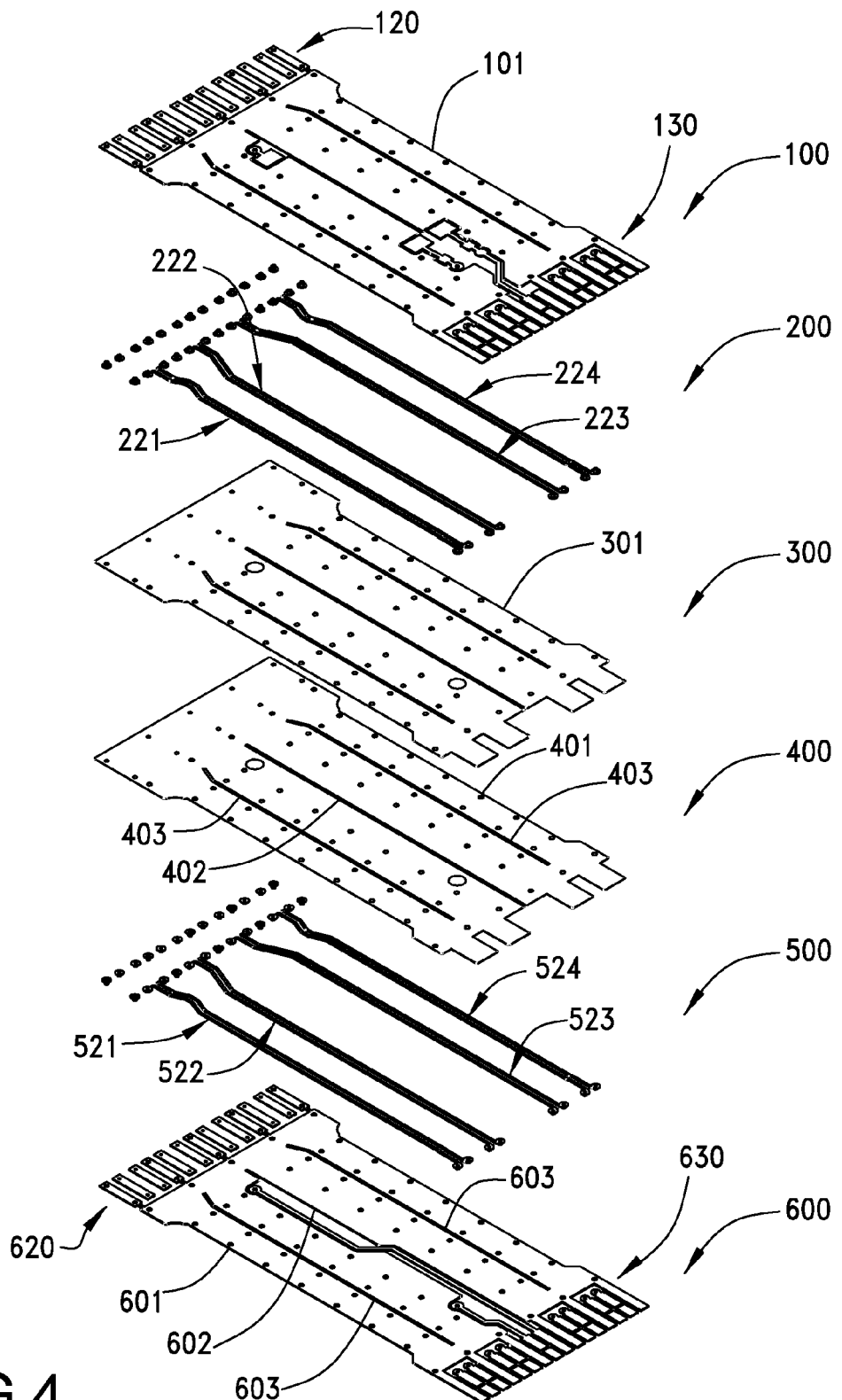
FIG. 4 is an exploded perspective view of the various conductive layers of the circuit board of FIG. 5.

Referring to FIGS. 3 and 4, circuit board 40 is a multi-layer circuit board with six conductive layers and a dielectric layer between adjacent conductive layers. Circuit board 40 also includes plated through-holes or vias 51-58 that pass through the various dielectric layers and interconnect conductors located on one conductive layer to one or more conductors located on one or more other conductive layers. The vias are tube-like structures typically formed by creating a hole in the circuit board and then plating the inner surface of the hole. Circuit board 40, as depicted, includes distinct circuitry for channels designated for transmitting signals and distinct circuitry for channels designated for receiving signals and may further include circuitry for other functions such as system controls, identification and power transmission.

When transmitting high speed signals, it is typically desirable to minimize the impact of the high speed signals associated with one channel on the high speed signals of other channels. It is thus typically desirable to increase the electrical isolation between channels and, in the embodiment depicted, increase the isolation between the transmit and receive channels. Achieving this result is complicated by the utilization of common reference layers or planes and the interconnection of multiple reference planes within the circuit board which may cause energy associated with the reference planes that act as a return path for the signal conductors of one channel to negatively impact the reference planes associated with the signal conductors of the other channels. The transfer of energy along the reference planes associated with the different sets of signal conductors can reduce the electrical isolation between channels and decrease their performance.

Referring to FIG. 4, it can be seen that circuit board 40 has six conductive layers 100, 200, 300, 400, 500 and 600. It should be noted that layers 100 and 600 are similar, layers 200 and 500 are identical and layers 300 and 400 are identical so that the high speed components of the board 40 have substantially identical functionality. More specifically, innermost layers 300 and 400, which are the third and fourth layers and act as reference or ground layers, are identical. Likewise, layers 200 and 500, which are the second and fifth layers and generally act as signal layers, are also identical. Layers 100 and 600, which are the first and sixth layers and are primarily reference or ground layers or planes, are generally identical. Layers 100 and 600 differ in that they have additional circuitry that is utilized to connect components on top of the circuit board 40 and provide other functionality. This additional circuitry is typically positioned so as not to affect the high speed performance of the circuit board 40. The descriptions of duplicate aspects of layers 100-600 are not repeated herein and components of layers 400-600 are identified by reference numbers similar to those of layers 100-300 but differ relative to their first digit that corresponds to the respective conductive layer.

In general, layers 100, 300, 400 and 600 include only reference or ground conductors and layers 200 and 500 include only signal conductors. Conductive vias extend through the dielectric layers separating the conductive layers and are utilized to connect various conductors of the different conductive layers. A first row 120 of conductive pads is positioned at a first end 42 of the circuit board 40 and a second row 130 of conductive pads is positioned at the opposite end 43 of the circuit board with the reference plane 101 extending therebetween. First row 120 of pads includes a repeating array of pads with a pair of signal pads 121-128 positioned between spaced apart pairs of reference or ground pads 129. The end 129a of each reference pad 129 connected to reference plane 101 is narrower than the rest of conductive pad 129 in order to reduce heat transfer from pads 129 to plane 101 during the process of attaching wires 33 to pads 129. This permits the use of a lower temperature soldering process which is less likely to cause damage to or degrade the circuit board 40. Each of the conductive pads 121-129 has a pair of holes 141a, 141b generally located at opposite ends thereof that are connected to vias 52, 53, 56, 57 that extend between the first conductive layer 100 and the second conductive layer 200.

The second row 130 of conductive pads also includes an array of conductive pads with four pairs of signal pads 131-138 positioned with reference pads 139 on opposite sides of each pair of the signal pads. Signal pads 131-138 each include an electrically operative section 131a-138a and a non-electrically operative section 131b-138b. The electrically operative sections 131a-138a are shorter (in a direction parallel to the longitudinal axis L of circuit board 40) than the signal pads 121-128 in order to provide a shorter electrical stub which improves the electrical performance of the signal circuits. The non-electrically operative sections 131b-138b are spaced from and electrically distinct from the electrically operative sections 131a-138a and serve to provide a smooth path on which the mating electrical terminals 26 (FIG. 1) of mating connector 23 may slide along as the cable assembly 30 is inserted into the board mounted connector assembly 22. More specifically, the non-electrically operative sections 131b-138b provide a smoother surface, and thus cause less wear on terminals 26 than does a bare circuit board which does not include any plating.

Each of the electrically operative sections 131a-138a of the second row of contact pads 130 includes a hole 142 electrically connected to a via 54 to connect the electrically operative sections 131a-138a to their respective signal conductors 211-218 located on second conductive layer 200. It should be noted that the reference pads 139 of the second row 130 of conductive pads have a uniform width in contrast to reference pads 129 of first row 120 that include the narrow section 129a at the junction of reference pads 129 and reference plane 101.

While the first row 120 of conductive pads includes eight signal pads and five reference pads 129, the second row 130 includes eight signal pads 131-138 and six reference pads 139 together with two additional pads 143, 144 (FIG. 5) located adjacent the center of the row. Reference pad 143 includes an electrically operative section 143a and a non-electrically operative section 143b. Electrically operative section 143a is connected to a circuit member 145 for providing additional functionality such as system control or identification. As depicted, contact pad 144 is not electrically connected to any of the circuitry depicted but could be used for adding other functionality as desired.

Figure 5:
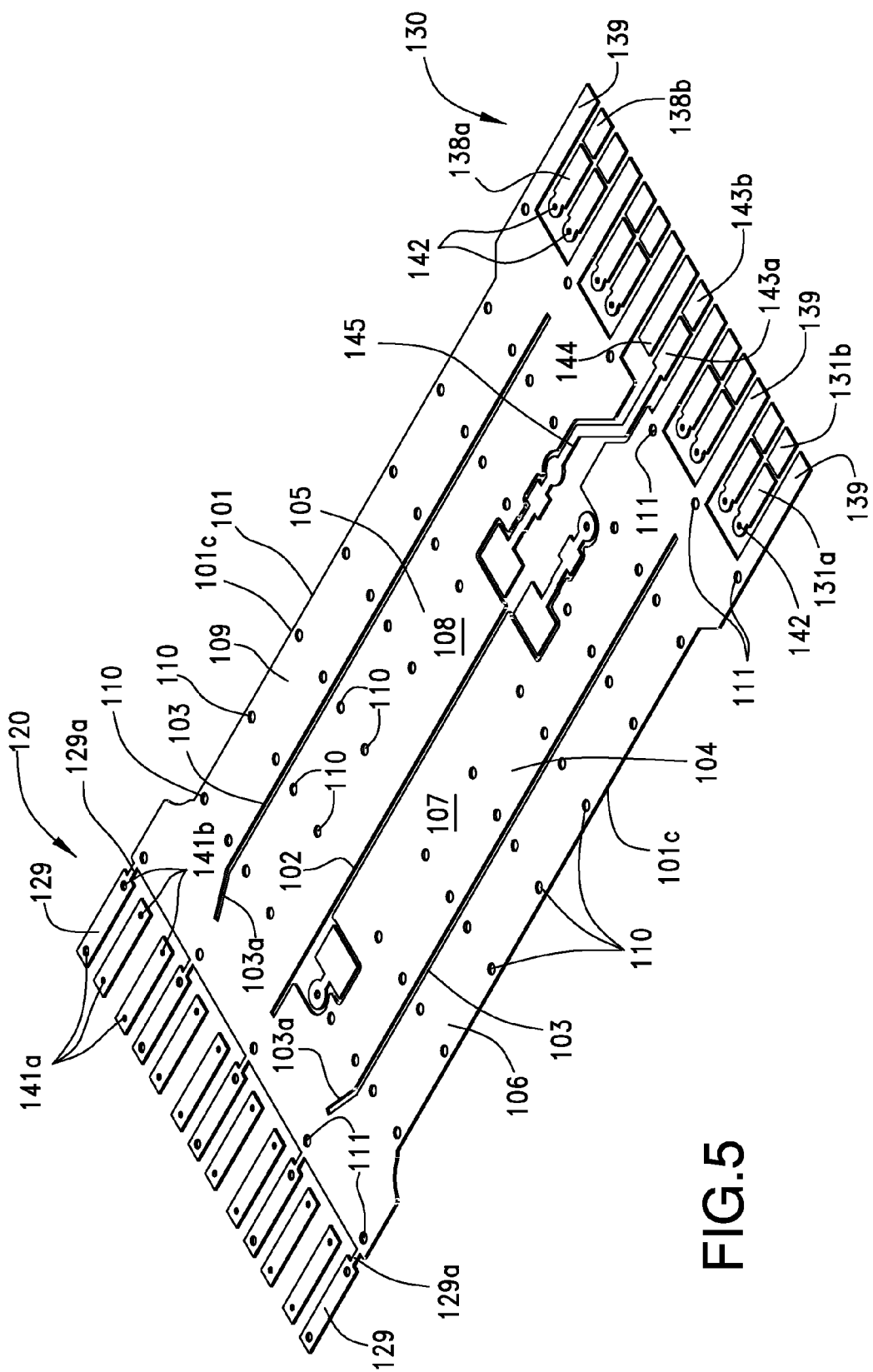
FIG. 5 is a perspective view of the first conductive layer of the circuit board of FIG. 3.

Referring to FIG. 5, the majority of the first layer 100 is a reference or ground plane 101. A central slot 102 in reference plane 101 extends generally along the longitudinal centerline of circuit board 40 and a pair of additional slots 103 are generally parallel to central slot 102 and located between the central slot and the sides 41 of circuit board 40. The central slot 102 generally divides reference plane 101 into two equal halves or regions 104, 105. Each of these regions 104, 105 further includes an additional slot 103 that is generally parallel to slot 102 but is closer to its respective side 101c of reference plane 101 than central slot 102. The end 103a of each additional slot 103 closest to row 120 of conductive pads is at an angle to longitudinal axis "L" of circuit member 40 so as to generally follow the path of the signal conductors of second conductive layer 200. The additional slots 103 generally divide the first region 104 into first and second sub-regions 106, 107, and generally divide second region 105 into first and second sub-regions 108, 109. Each of the sub-regions 106-109 includes two linear arrays of holes 110 that extend generally parallel to the central slot 102 and additional slots 103 and are interconnected to vias 51 to electrically connect reference plane 101 to reference plane 301. Reference plane 101 further includes a plurality of holes 111, each adjacent a reference pad 129, 139, that are connected to vias 55 to further electrically connect reference plane 101 to reference plane 301.

Figure 6:
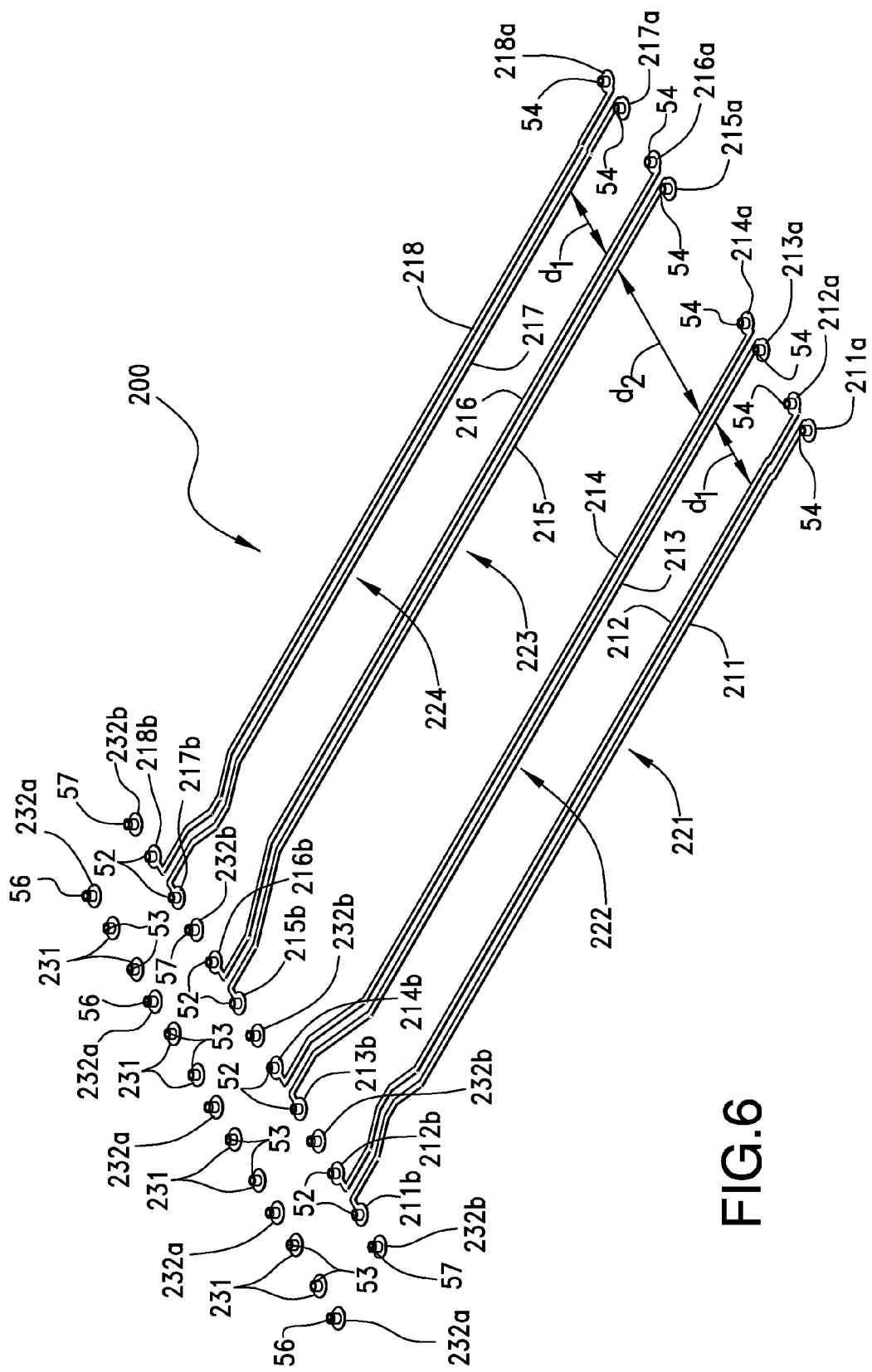
FIG. 6 is a perspective view of the second conductive layer of the circuit board of FIG. 3 together with some of the vias that connect conductors of the second layer to conductors of the first layer.

Referring to FIGS. 4 and 6, the second layer 200 is depicted as including eight signal conductors 211-218 that are configured as pairs of signal conductors 221-224. In the embodiment depicted, pairs 221, 222 of signal conductors 211-214 are utilized as a portion of the transmit channels within circuit board 40 and the pairs 223, 224 of signal conductors 215-218 are utilized as a portion of the receive channels within circuit board 40. It should be noted that the pairs 221, 222 of signal conductors associated with the transmit channels and the pairs 223, 224 of signal conductors associated with the receive channels are spaced apart a first distance $d_1$ that defines the distance between common pairs (e.g., between transmit pairs or between receive pairs), and the distance $d_2$ between the inner transmit pair 222 and the inner receive pair 223 is greater than the distance between the common pairs (i.e., $d_2 > d_1$). This spacing reduces crosstalk or interference between the transmit and receive channels.

Each signal conductor 211-218 includes a generally circular end portion 211a-218a that is generally positioned beneath the second row 130 of conductive pads and aligned with holes 142 and respective contact pads 131-138 of the first conductive layer 100. Conductive vias 54 extend from the generally circular ends 211a-218a to the holes 142 in each of the conductive pads 131-138. The opposite end of the signal conductors 211-218 also includes generally circular ends 211b-218b with a conductive via 52 extending from each generally circular end to the hole 141b of each of the signal pads 121-128 of the first row 120 of conductive pads. A generally circular anchor 231 is longitudinally aligned with the each generally circular end 211b-218b and is connected to hole 141a of each signal pads 121-128 of the first row 120 of conductive pads by a via 53. By securing each signal pad 121-128 to its respective circular anchor 231, the signal pads are more securely fixed to the circuit board 40 and are less likely to peel off of the surface of the circuit board during or after the process of soldering a wire 33 to each pad. Similarly, a generally circular anchor 232a, 232b is vertically aligned with each hole 141a, 141b, respectively, of each reference pad 129 of row 120. Conductive vias 56, 57 extend between and mechanically and electrically connect the anchors 232a, 232b to their respective holes 141a, 141b and thus increase the strength with which reference pads 129 are secured to circuit board 40.

Figure 7:
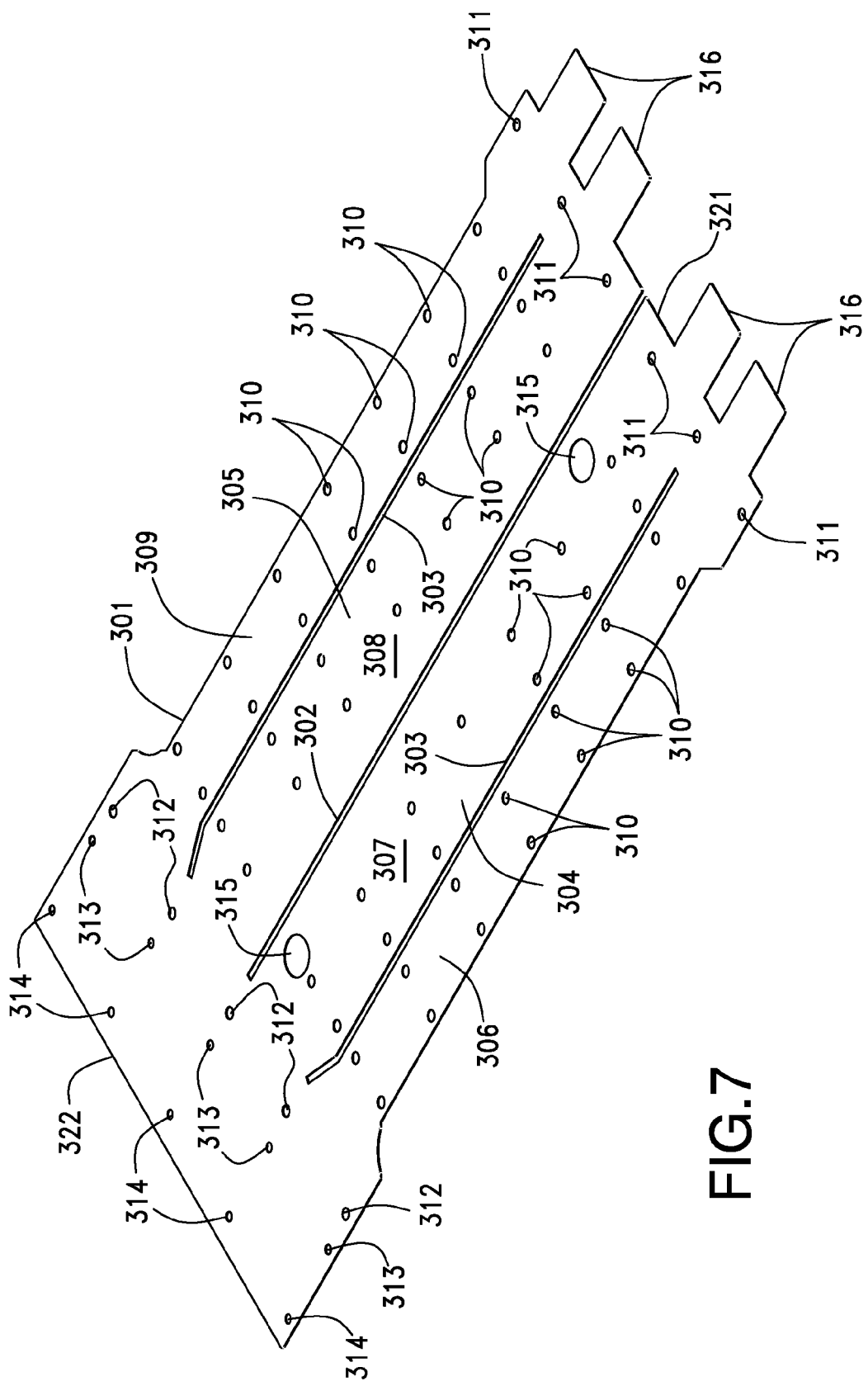
FIG. 7 is a perspective view of the third conductive layer of the circuit board of FIG. 3.

Referring to FIG. 7, conductive layer 300 is generally a solid reference or ground plane 301 with various openings therein. A central slot 302 extends generally along and parallel to the longitudinal axis L of the circuit board 40 from an edge 321 generally adjacent the second row 130 of conductive pads towards but spaced from the opposite edge 322 generally adjacent the first row 120 of conductive pads. Central slot 302 divides the reference plane 301 into first and second regions 304, 305 and additional slots 303 extend generally parallel to central slot 302 and one divides the first region 304 into first and second sub-regions 306, 307 and the other divides second region 305 into first and second sub-region 308, 309. The central slot 302 of the reference plane 301 is substantially identical to central slot 102 of the first reference plane 101 except that the central slot 302 extends to edge 321 in a linear manner. Additional slots 303 are identical in size and orientation relative to additional slots 103 of reference plane 101. Each of the sub-regions 306-309 includes two linear arrays of holes 310 that are aligned with the linear arrays of holes 110 in first reference plane 101 and are generally perpendicular to the longitudinal axis of reference plane 301.

Reference plane 301 further includes holes 311 that are generally adjacent edge 321 and aligned with holes 111 of first reference plane 101. The reference plane 301 includes three additional transverse linear arrays of holes 312, 313, 314 that are generally adjacent the opposite edge 322 of the reference plane. The linear array of holes 312 is generally perpendicular to the longitudinal axis "L" of circuit member 40 and aligned with holes 111 of reference plane 101 adjacent row 120 of conductive pads. The array of holes 313 is generally parallel to holes 312 and each is aligned with a hole 141b of reference pads 129 of the first row 120 of conductive pads. The linear array of holes 314 closest to edge 322 and is generally transverse to the longitudinal axis "L" and each hole is aligned with one of the holes 141a of the reference pads 129 of first reference plane 101. Holes 315 are provided in reference plane 301 in order to provide a path for conductive vias 58 (FIG. 3) between signal components of the various layers to pass through reference plane 301 without making electrical contact. Projections or fingers 316 extend from edge 321 of reference plane 301 and are aligned with the signal pads 131-138 of the second row 130 of conductive pads of first conductive layer 100 in order to provide additional vertical shielding between the signal pads of row 130 of layer 100 and row 630 of layer 600.

As stated above, conductive layers 100 and 600 are similar, layers 200 and 500 are identical as are layers 300 and 400. Accordingly, the descriptions of layers 400-600 are omitted. However, in the figures that includes layers 400-600, components of layers 400-600 are identified with reference numbers similar to those of layers 100-300 but utilize a first digit corresponding to their respective conductive layer. For example, reference plane 301 of the third conductive layer includes a central slot 302. In the fourth conductive layer 400, the reference plane is identified as 401 and the central slot is 403.

Figure 8:
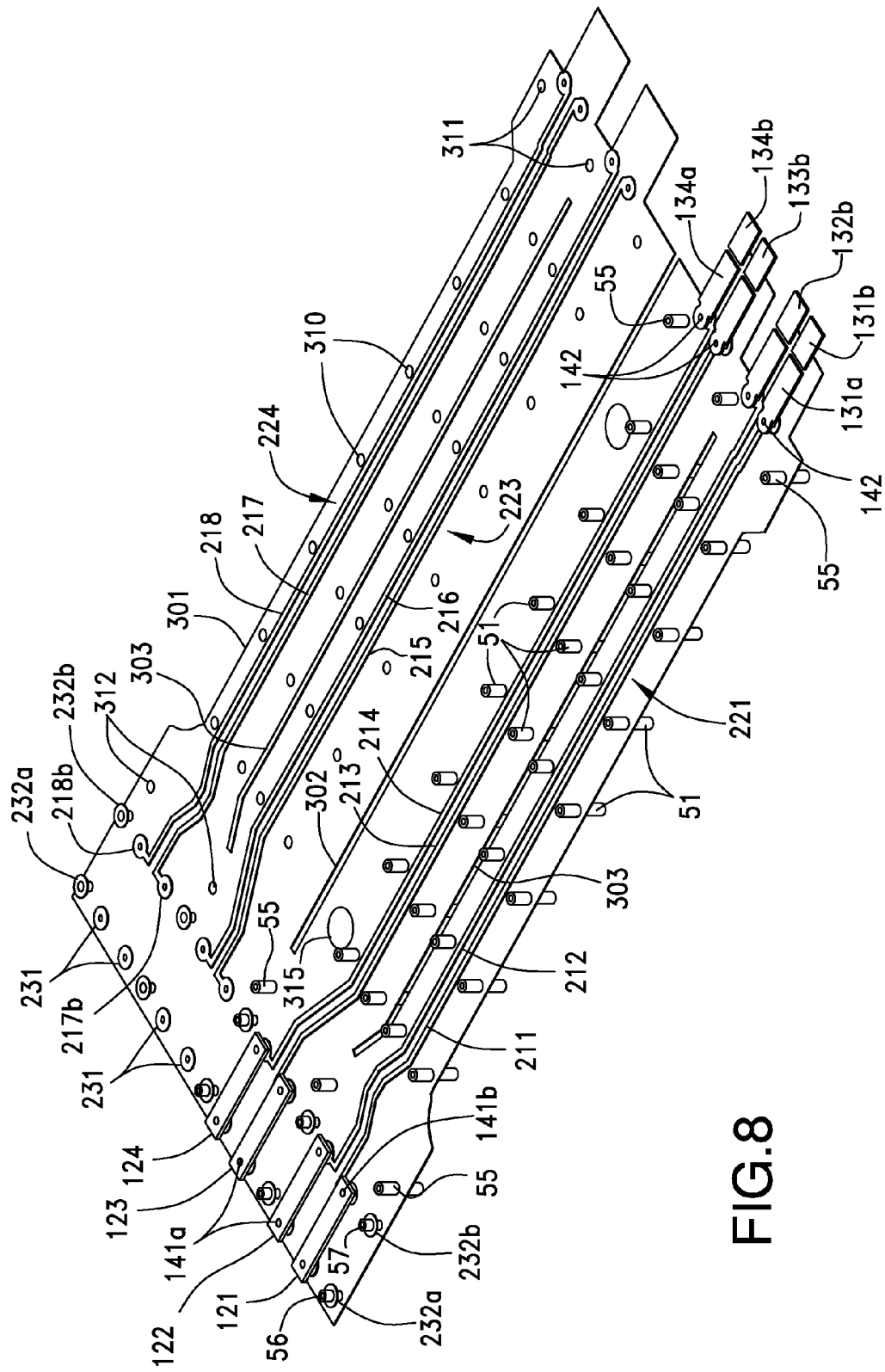
FIG. 8 is a perspective view of the second and third conductive layers together with some of the conductive pads of the first conductive layer and some of the conductive vias that extend between conductive layers to interconnect various conductors.
Figure 9:
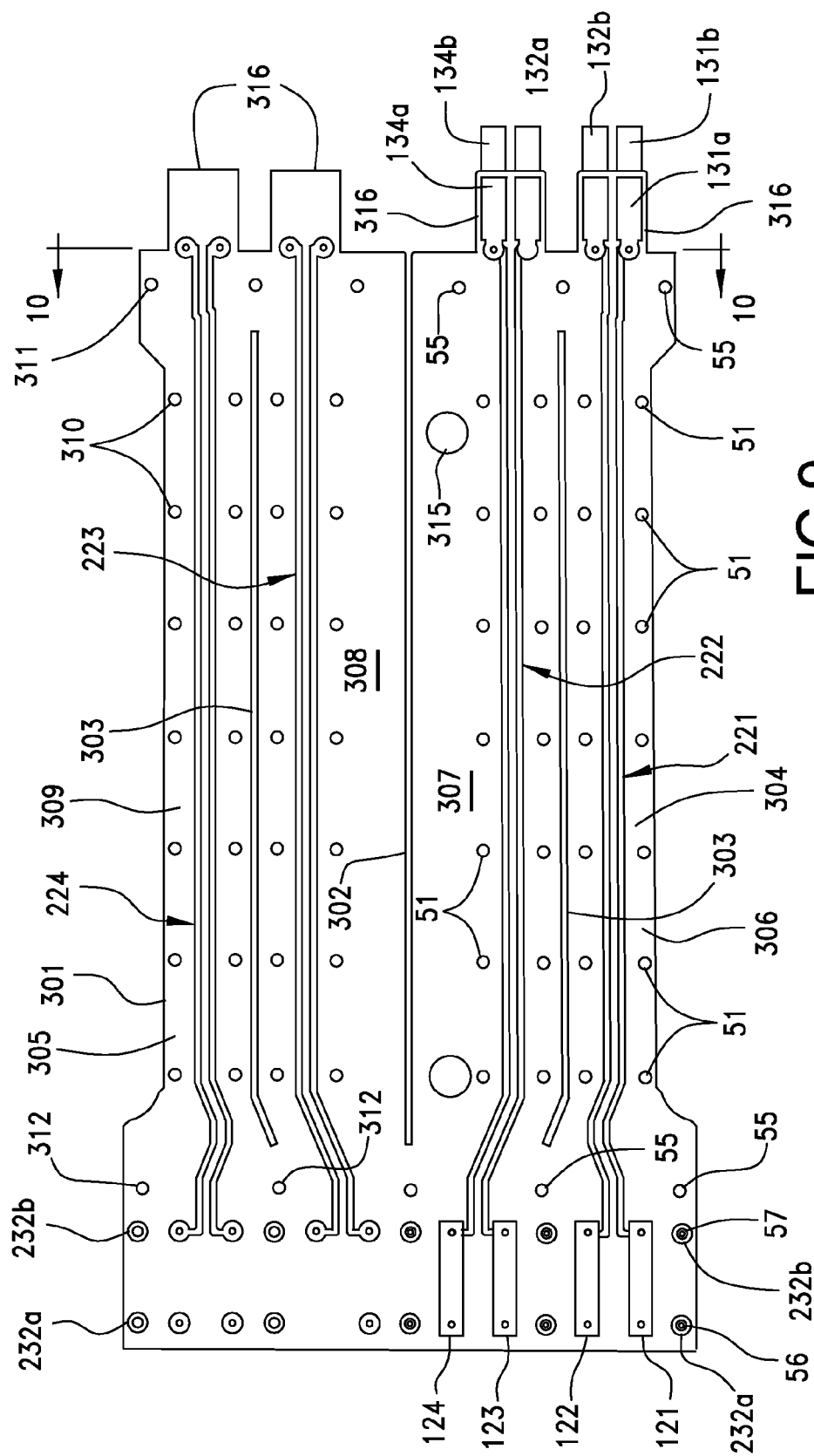
FIG. 9 is a top plan view of the conductive layers of FIG. 8.
Figure 10:
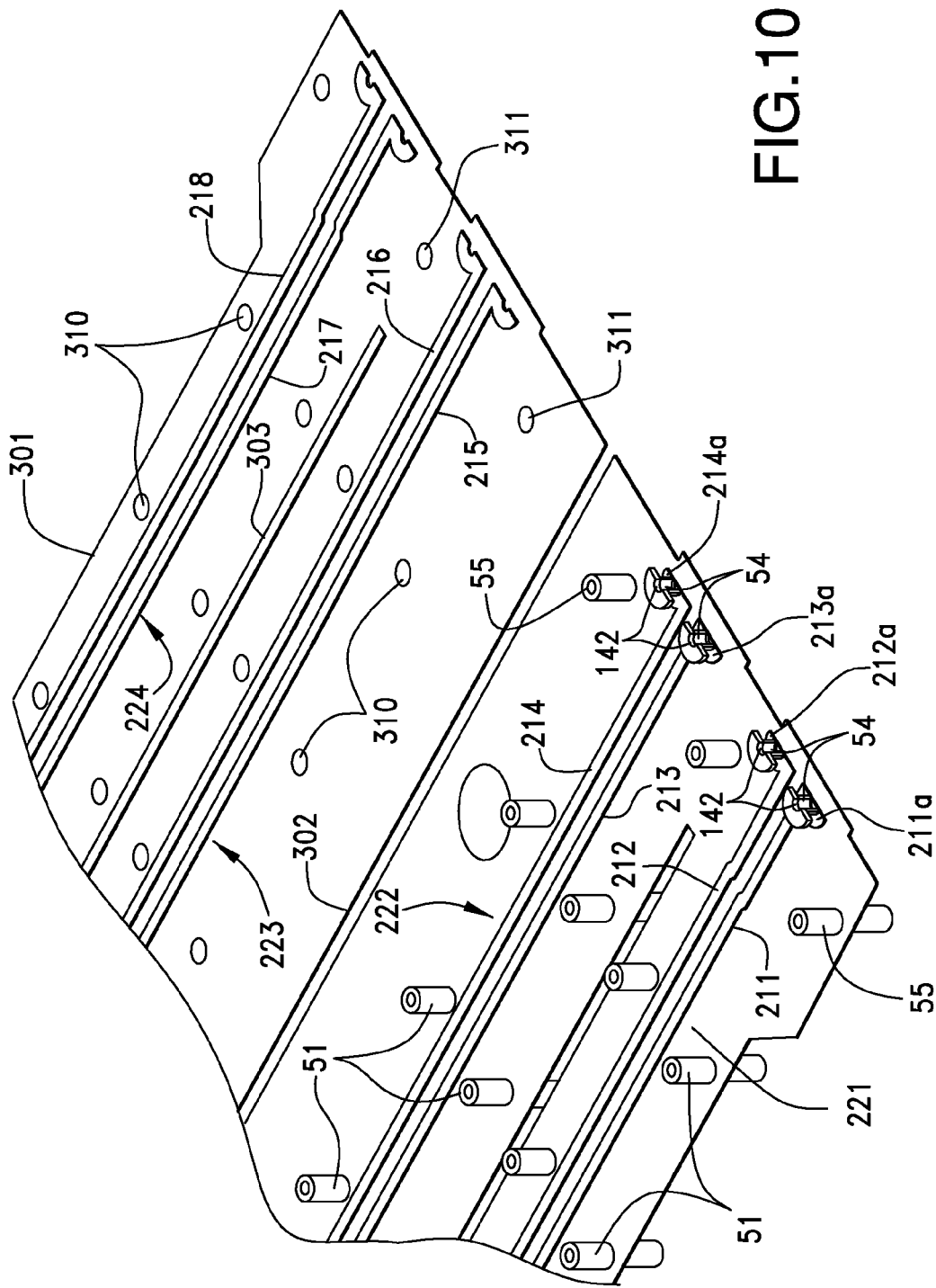
FIG. 10 is an enlarged, fragmented perspective view of the conductive layers of FIG. 9 taken generally along line 10-10 of FIG. 9.
Figure 11:
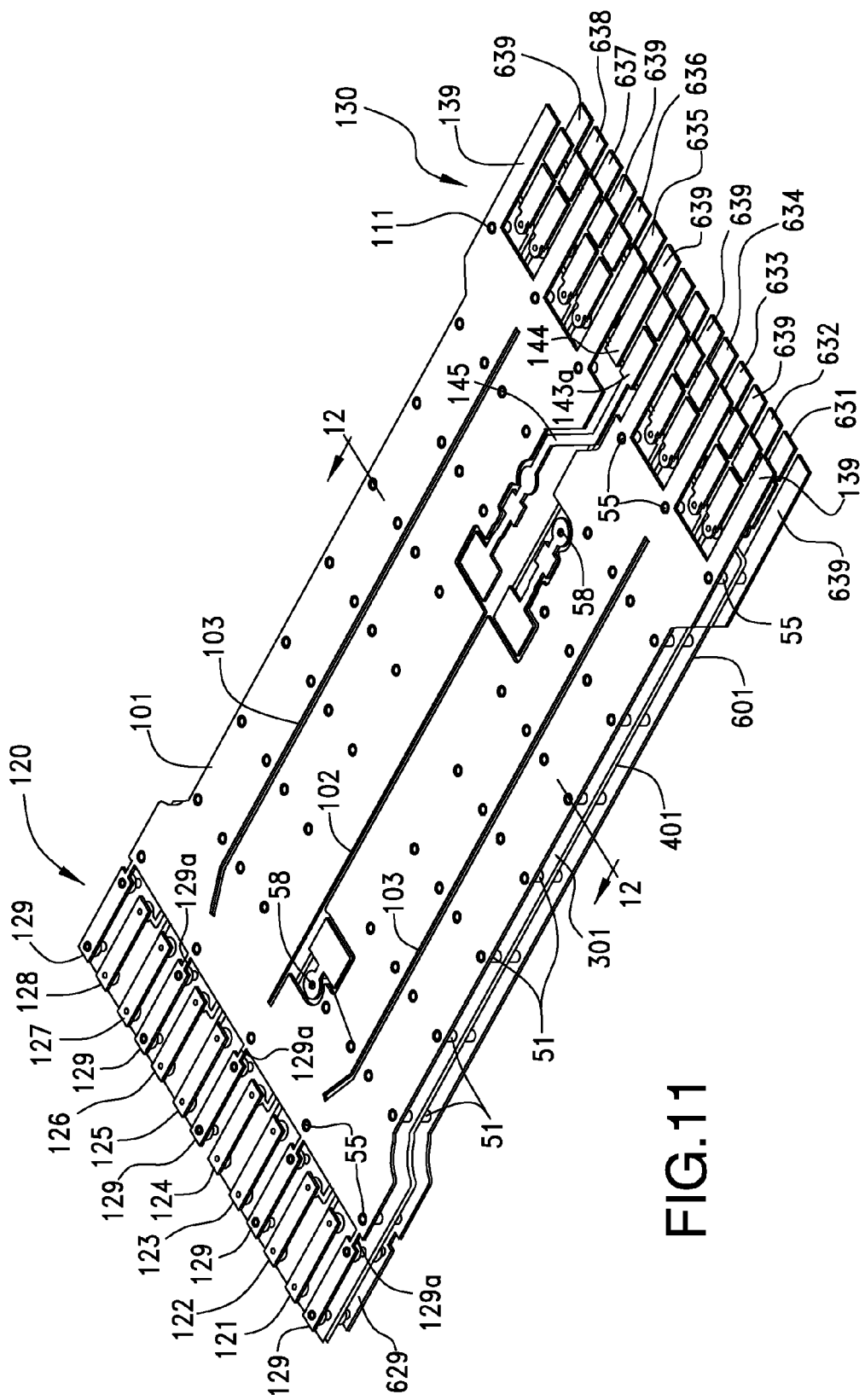
FIG. 11 is a perspective view of the circuit board of FIG. 3 with the dielectric layers removed for clarity.
Figure 12:
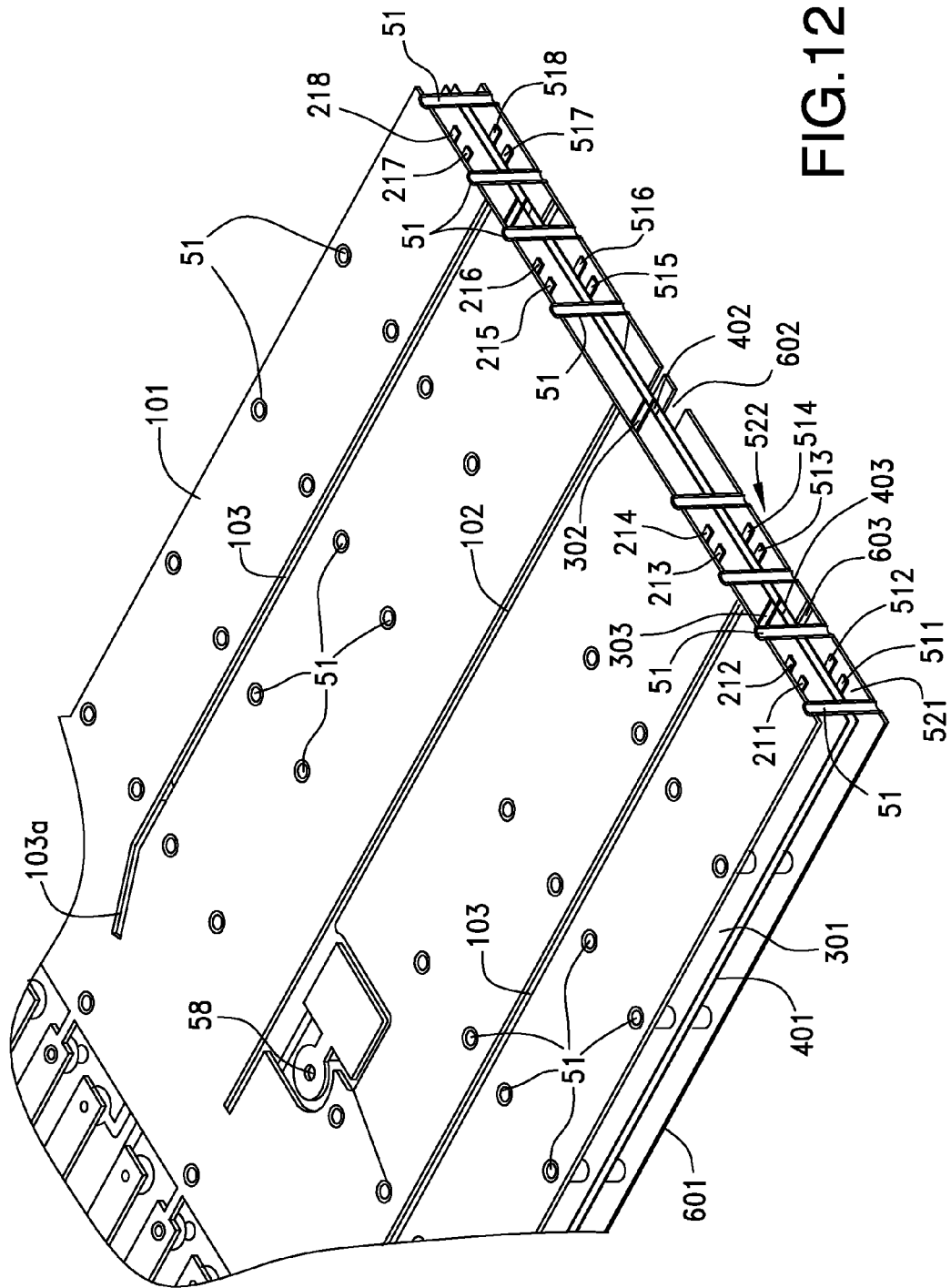
FIG. 12 is an enlarged, fragmented perspective view of the conductive layers of FIG. 11 taken generally along line 12-12 of FIG. 11.

Referring to FIGS. 8-10, only certain components of the conductive layers 100-300 are depicted in order to enhance the description of certain aspects of the disclosed embodiment. Reference plane 301 is depicted with the signal conductors of the second conductive layer 200 together with some of the vias that interconnect the various reference planes as well as the conductive pads 121-124, 131-134. More specifically, reference plane 301 is depicted with each of the signal pairs 221-224 positioned above the reference plane. Pair 221 is shown connected to conductive pads 121, 122 at one end 42 of circuit board 40 and connected to pads 131, 132 at the opposite end 43 of the circuit board. Referring to FIG. 10, the generally circular ends 211a-214a of signal conductors 211-214 are shown as being connected to the circular holes 142 in the contact pads 131-134 by vias 54.

Referring to FIGS. 4, 11-13, the circuit board 40 is formed of essentially identical top and bottom halves except for certain low speed circuit components and traces. Conductive layers 100, 300, 400 and 600 are interconnected by a plurality of vias 51, 55 that electrically connect and provide a low conductivity path between the conductive reference planes. The first row 120 of conductive pads of first layer 100 is aligned with the first row 620 (FIG. 4) of conductive pads of the sixth conductive layer 600. Likewise, the second row 130 of conductive pads of the first conductive layer 100 is aligned with the second row 630 of conductive pads of the sixth conductive layer 600. The central slot 102 of first conductive layer 100 is aligned with central slot 302 of the third reference plane 301, the central slot 402 of reference plane 401 and the central slot 602 of reference plane 601 of conductive layer 600. Similarly, the additional slots 103 of reference plane 101 of first conductive layer 100 are aligned with the additional slots 303 of reference plane 301 of third conductive layer 300, the additional slots 403 of reference plane 401 of fourth conductive layer 400 and the additional slots 603 of reference plane 601 of the sixth conductive layer 600. Each pair 221-224 of signal conductors of the second conductive layer 200 is positioned between the reference plane 101 of the first conductive layer 100 and the reference plane 301 of the third conductive layer 300. Similarly, the conductive pairs 521-524 are positioned between the fourth reference plane 401 of the fourth conductive layer 400 and the sixth reference plane 601 of the sixth conductive layer.

Figure 13:
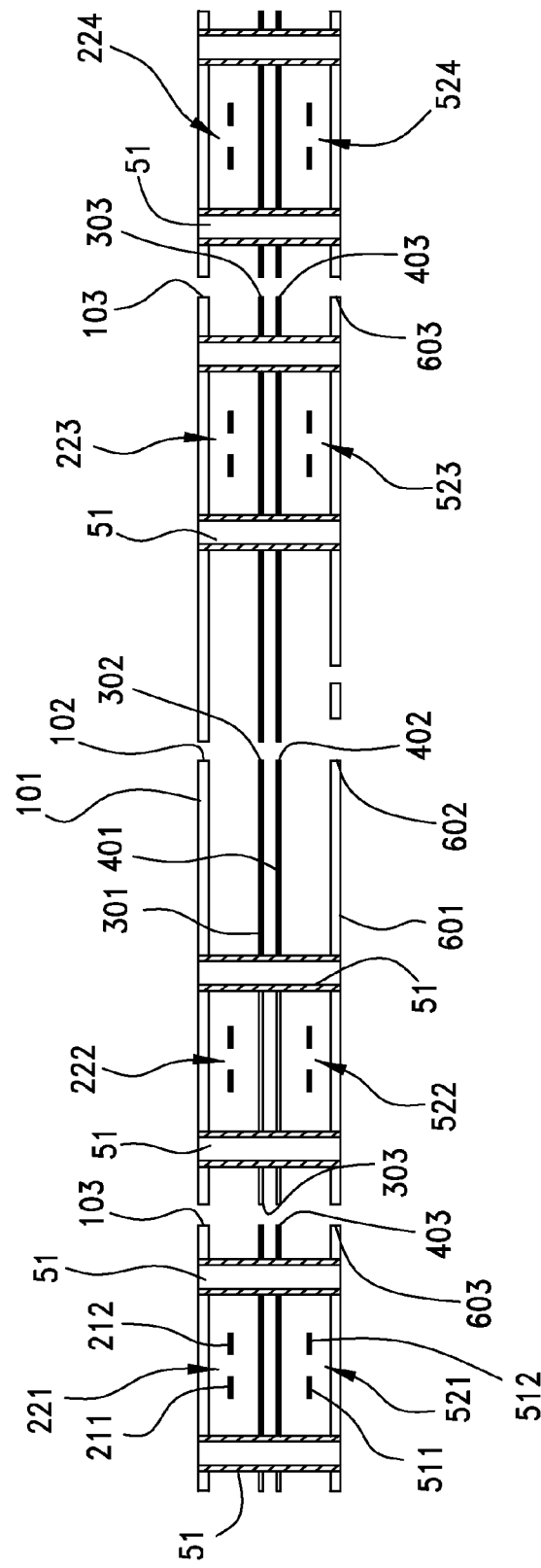
FIG. 13 is a cross-sectional view of the conductive layers of FIG. 12 with certain components removed for clarity.

The conductive vias 51 extend through and are electrically connected to the linear array of holes 110 in first reference plane 101, the linear array of holes 310 in reference plane 301, the linear array of holes 410 in reference plane 401 and the linear array of holes 610 in reference plane 601. These vias extend generally perpendicularly to the planes of the reference planes 101, 301, 401 and 601 and, in combination with the reference planes, create conductive paths that generally encircle each pair of signal conductors 221-224, 521-524 (FIG. 13). In other words, by positioning the vias 51 along and generally parallel to the paths of the signal conductors, the signal conductors have relatively uniform reference planes adjacent thereto to serve as both an EMI shield and a return path. More specifically, horizontal reference planes are provided along the length of the signal conductors by the reference planes 101, 301, 401, 601 and vertical reference conductors are provided along relatively uniform intervals by vias 51. The number of vias and spacing between the vias can be varied as desired within the system requirements of the circuit board 40.

Energy associated with one signal pair may travel along one of the reference planes or through the vias to another signal pair and negatively impact the other signal pair by imparting noise into that signal pair. In order to limit the impact of one pair of signal conductors on the other pairs, slots 102, 103, 302, 303, 402, 403, 602, 603 are incorporated into the reference plans 101, 301, 401, 601. These slots act as a circuit interruption within the reference plane to increase the path length between the regions of the reference planes. For example, referring to FIGS. 7 and 9, slot 302 increases the path length between the first and second regions 304, 305 of reference plane 301. This is achieved by providing an area of increased impedance or reduced electrical conductivity (in the form of slot 302) between first and second regions 304, 305 that forces any currents within reference plane 301 to travel around the slot 302. As a result, energy traveling along reference plane 301 adjacent the first region 304 is electrically separated from a direct connection to the second region 305 by slot 302 except near the row 120 of contact pads. As a result, the energy in the first region 304 must travel a greater distance on the reference plane 301 before reaching second region 305 and thus has less of an impact on the signal pairs 223, 224 adjacent the second region than if slot 302 were not present. The longer electrical path between the first and second regions 304, 305 results in additional dissipation of energy and thus will increase the isolation of the signal conductors 211-214 associated with transmit channels of the circuit board 40 from the signal conductors 215-218 associated with the receive channels of the circuit board.

In the depicted embodiment, the ends of regions 304 and 305 adjacent row 120 of the conductive pads remain electrically connected so that the loop inductance of the circuits is not increased to the point of negating the benefit of slot 302. The opposite ends of regions 304 and 305 (adjacent row 130) are not connected within the reference plane 301 as they are electrically connected through the vias 55 and reference pads 139 of conductive layer 100. More specifically, an electrical path exists between the ends of regions 304 and 305 adjacent row 130 through a path defined by vias 55, reference plane 101, along conductive reference pads 139 and then through a mating connector assembly 22. If a shorter path were desired, the slot 301 could be configured so as not to extend to the end 43 of circuit board 40. In other words, in some instances, it may be desirable to interconnect both ends (adjacent the conductive pads of row 120 and row 130, respectively) of regions 304, 305. In still other instances, it may be desirable to extend slot 302 so that it extends to both ends 42, 43 of circuit board 40. The slots 302, 303 are depicted as being approximately the seventy to ninety percent of the length of the signal conductors 211-218. However, the lengths of the slots could be made longer or shorter depending on the desired electrical performance and system conditions. It is believed that shorter slots will likely decrease the electrical isolation between signal pairs but also decrease the length of some of the return paths. Similarly, increasing the slot lengths will increase the electrical isolation but also increase the length of some of the return paths associated with such reference plane. Since reference plane 301 forms a portion of the circuits that are associated with signal pairs 221-224, an appropriate balance of return path length with the amount of circuit interruption created by slots 302, 303 is desirable.

In order to limit the impact of the signal conductors 211-214 associated with transmit channels of the circuit board 40 on the signal conductors 215-218 associated with the receive channels of the circuit board (i.e., increase the electrical isolation between transmit and receive channels), central slot 102 is provided in reference plane 101 and central slot 302 is provided in reference plane 301. Similarly, central slot 403 is provided in reference plane 401 and central slot 603 is provided in reference plane 601 in order to increase the electrical isolation between signal conductors 511-514 of the transmit channels of circuit board 40 from the signal conductors 515-518 of the receive channels of the circuit board. The additional slot 103 in region 104 of reference plane 101 and the aligned additional slot 303 of reference plane 301 may be provided, if desired, in order to further isolate the first pair 221 of signal conductors from the second pair 222 of signal conductors even though both pairs are used for transmitting signals along the transmit channels. Similarly, the other additional slot 103 may be provided in region 105 of the reference glance 101 and additional slot 303 may be provided in region 305 of reference plane 301 in order to increase the electrical isolation between third pair 223 of signal conductors and fourth pair 224 of signal conductors. Similarly, additional slots 403 and 603 may be provided to increase the isolation between signal pairs 621, 622 and 623, 624.

While the slots are depicted as having a series of straight and angled sections, the shape of the slots is configured in the depicted embodiment based upon the paths of the signal conductors. Slots of other shapes, dimensions and aspect ratios could be utilized. In addition, while the slot is depicted as being devoid of conductive material to act as a circuit interruption within the reference plane to increase the path length between regions of a reference plane, other structures and components could also be used for that purpose. For example, in some circumstances, it may be possible to use an area having a cross-hatched or roughened surface to reduce the conductivity and create an area of increased impedance or reduced electrical conductivity. Still further, it may be possible to bridge the slots with circuit components such as inductors or capacitors to control the communication path across the slot based upon the frequency at which the system or signals operate. By utilizing appropriate inductors across the slot, for example, frequencies above a predetermined value would be forced around the slot and along the increased path length while lower frequencies would pass across the slot through the inductors.

Figure 14:
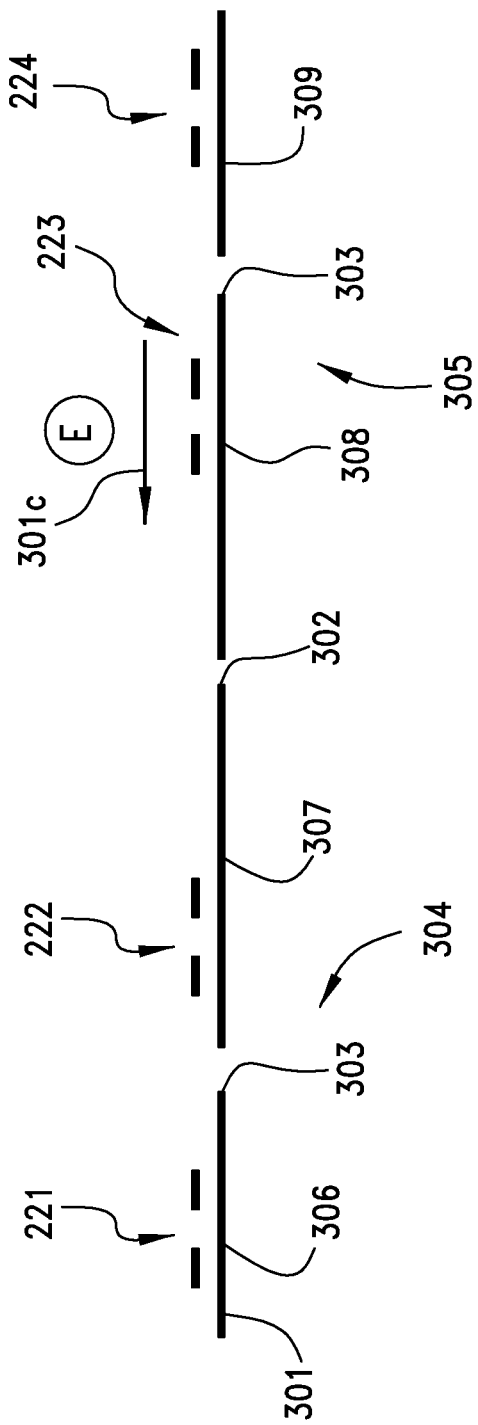
FIG. 14 is a generally schematic cross-sectional view similar to FIG. 13 with additional components removed for clarity.

FIG. 14 depicts a somewhat schematic cross-section of FIG. 13 with only certain aspects depicted and other aspects modified. More specifically, only the pairs 221-224 of the signal conductors of the second conductive layer 200 and conductive reference plane 301 are shown. To the extent that signals passing through pair 223 of the signal conductors act as an energy source "E" adjacent reference plane 301, current may pass along reference plane 301 at 301c. However, further movement of the current along reference plane 301 directly towards pairs 221, 222 of signal conductors is prevented due to slot 302 in the reference plane 301. The current or energy on reference plane 301 will need to travel a longer route around slot 302 (which increases the path length) to reach the sub-region 307 of reference plane 301 directly adjacent the pair 222 of signal conductors. The longer path length will decrease the amount of energy on the reference plane 301 adjacent the pair 222 of signal conductors and thus the energy source "E" will have less of an impact on the other pairs of signal conductors. If additional slots 303 are provided, current on reference plane 301 will also need to travel around the additional slots which will increase the electrical isolation of the pair 223 of signal conductors from each of the other pairs 221, 223, 224.

Although the disclosure provided has been described in terms of illustrated embodiments, it is to be understood that the disclosure is not to be interpreted as limiting. Various alterations and modifications will no doubt become apparent to those skilled in the art after having read the above disclosure. Accordingly, numerous other embodiments, modifications and variations within the scope and spirit of the appended claims will occur to persons of ordinary skill in the art from a review of this disclosure.

The invention claimed is:

1. A multi-layer circuit member comprising:
   a reference plane formed of a conductive material, the reference plane including first and second regions that are electrically connected;
   a first pair of signal conductors adjacent the first region of the reference plane;
   a second pair of signal conductors adjacent the second region of the reference plane, wherein the first and second pair of signal conductors are adjacent each other; and
   an elongated area of increased impedance in the reference plane located between the first and second electrically connected regions, the elongated area of increased impedance positioned between the first and second pair of signal conductors.

2. The multi-layer circuit member of claim 1, wherein the elongated area of increased impedance is a slot in the reference plane.

3. The multi-layer circuit member of claim 2, further including a second conductive reference plane, the first and second pairs of signal conductors being positioned between the reference plane and the second reference plane.

4. The multi-layer circuit member of claim 3, wherein the second reference plane includes third and fourth regions that are electrically connected and that are separated by a second slot in the second reference plane, the third and fourth regions being generally aligned with the first and second regions of the reference plane and the second slot being generally aligned with the slot.

5. The multi-layer circuit member of claim 4, further including a plurality of first and second conductive members electrically connecting the reference plane and the second reference plane, the plurality of first conductive members being positioned on opposite sides of the first pair of signal conductors and the plurality of second conductive members being positioned on opposite sides of the second pair of signal conductors.

6. The multi-layer circuit member of claim 5, wherein the plurality of first conductive members are positioned generally parallel to the first pair of signal conductors on one side of the slot and the second slot and the plurality of second conductive members are positioned generally parallel to the second pair of signal conductors on an opposite side of the slot and the second slot.

7. The multi-layer circuit member of claim 2, wherein the slot extends generally to an edge of the reference plane.

8. The multi-layer circuit member of claim 1, wherein the reference plane further includes a third region adjacent and electrically connected to the first region and a fourth region adjacent and electrically connected to the second region, and further including a third pair of signal conductors adjacent the third region of the reference plane and a fourth pair of signal conductors adjacent the fourth region of the reference plane.

9. The multi-layer circuit member of claim 8, further including second and third elongated areas of increased impedance in the reference plane, the second area of increased impedance being located between the first and third electrically connected regions and the third area of increased impedance being located between the second and fourth electrically connected regions.

10. The multi-layer circuit member of claim 8, wherein the first and third pairs of signal conductors are electrically connected to channels of the circuit member that transmit signals and the second and fourth pairs of signal conductors are electrically connected to channels of the circuit member that receive signals.

11. The multi-layer circuit member of claim 1, wherein the reference plane is a generally planar member positioned between insulative layers and the electrical connection between the first and second regions is within the plane of the reference plane.

12. The multi-layer circuit member of claim 4, wherein the reference plane and the second reference plane each further include a respective third region adjacent and electrically connected to its first region and a respective fourth region adjacent and electrically connected to its second region, and further including a third pair of signal conductors adjacent and between the third regions and a fourth pair of signal conductors adjacent and between the fourth regions.

13. The multi-layer circuit member of claim 12, wherein the reference plane and the second reference plane each include second and third slots, the second slots being located between the first and third electrically connected regions and the third slots being located between the second and fourth electrically connected regions.

14. The multi-layer circuit member of claim 1, wherein conductors of the first and second pairs of signal conductors each have a length and the area of increased impedance has a length equal to at least approximately 75% of the length of the signal conductors.

* * * * *